(12) United States Patent
Zhu et al.

(10) Patent No.: US 10,600,696 B2
(45) Date of Patent: Mar. 24, 2020

(54) IC UNIT AND METHOD OF MANUFACTURING THE SAME, AND ELECTRONIC DEVICE INCLUDING THE SAME

(71) Applicant: Institute of Microelectronics, Chinese Academy of Sciences, Beijing (CN)

(72) Inventors: Huilong Zhu, Poughkeepsie, NY (US); Zhengyong Zhu, Beijing (CN)

(73) Assignee: Institute of Microelectronics, Chinese Academy of Sciences, Beijing (CN)

( * ) Notice: Subject to any disclaimer, the term of this patent is extended or adjusted under 35 U.S.C. 154(b) by 0 days.

(21) Appl. No.: 16/421,009

(22) Filed: May 23, 2019

(65) Prior Publication Data
US 2019/0287865 A1    Sep. 19, 2019

Related U.S. Application Data

(63) Continuation of application No. 15/722,423, filed on Oct. 2, 2017.

(30) Foreign Application Priority Data

Sep. 30, 2016  (CN) .......................... 2016 1 0872541
Jun. 30, 2017   (CN) .......................... 2017 1 0530751

(51) Int. Cl.
*H01L 21/8238* (2006.01)
*H01L 21/8234* (2006.01)
(Continued)

(52) U.S. Cl.
CPC ...... *H01L 21/823885* (2013.01); *B82Y 10/00* (2013.01); *H01L 21/02532* (2013.01);
(Continued)

(58) Field of Classification Search
CPC ............. H01L 29/0676; H01L 29/1037; H01L 29/41741; H01L 29/42392;
(Continued)

(56) References Cited

U.S. PATENT DOCUMENTS 5,554,870 A    9/1996  Fitch et al.
7,781,827 B2   8/2010  Rao
(Continued)

FOREIGN PATENT DOCUMENTS

CN    1794466 A    6/2006
CN    1901225 A    1/2007
(Continued)

OTHER PUBLICATIONS

US 10,468,312 B2, 11/2019, Zhu et al. (withdrawn)
(Continued)

*Primary Examiner* — Matthew E Warren
(74) *Attorney, Agent, or Firm* — Schwegman Lundberg & Woessner, P.A.

(57) ABSTRACT

There are provided an Integrated Circuit (IC) unit, a method of manufacturing the same, and an electronic device including the IC unit. According to an embodiment, the IC unit includes a first source/drain layer, a channel layer and a second source/drain layer for a first device and a first source/drain layer, a channel layer and a second source/drain layer for a second device stacked in sequence on a substrate. In the first device, the channel layer includes a first portion and a second portion separated from each other. The first source/rain layer and the second source/drain layer each extend integrally to overlap both the first portion and the second portion of the channel layer. The IC unit further includes a first gate stack surrounding a periphery of the first portion and also a periphery of the second portion of the channel layer of the first device, and a second gate stack
(Continued)

surrounding a periphery of the channel layer of the second device.

10 Claims, 12 Drawing Sheets

(51) Int. Cl.
| | |
|---|---|
| H01L 29/06 | (2006.01) |
| H01L 29/417 | (2006.01) |
| H01L 29/66 | (2006.01) |
| H01L 21/3065 | (2006.01) |
| B82Y 10/00 | (2011.01) |
| H01L 29/267 | (2006.01) |
| H01L 29/775 | (2006.01) |
| H01L 29/786 | (2006.01) |
| H01L 21/02 | (2006.01) |
| H01L 29/04 | (2006.01) |
| H01L 29/165 | (2006.01) |
| H01L 29/423 | (2006.01) |
| H01L 29/78 | (2006.01) |
| H01L 21/225 | (2006.01) |
| H01L 21/324 | (2006.01) |
| H01L 29/08 | (2006.01) |
| H01L 29/10 | (2006.01) |
| H01L 29/15 | (2006.01) |
| H01L 29/205 | (2006.01) |
| H01L 29/45 | (2006.01) |
| H01L 29/778 | (2006.01) |
| H01L 21/308 | (2006.01) |
| H01L 21/822 | (2006.01) |
| H01L 27/092 | (2006.01) |
| H01L 21/3105 | (2006.01) |

(52) U.S. Cl.
CPC .... *H01L 21/02636* (2013.01); *H01L 21/2252* (2013.01); *H01L 21/2258* (2013.01); *H01L 21/3065* (2013.01); *H01L 21/3083* (2013.01); *H01L 21/324* (2013.01); *H01L 21/8221* (2013.01); *H01L 21/82345* (2013.01); *H01L 21/823412* (2013.01); *H01L 21/823418* (2013.01); *H01L 21/823475* (2013.01); *H01L 21/823487* (2013.01); *H01L 21/823807* (2013.01); *H01L 21/823814* (2013.01); *H01L 21/823842* (2013.01); *H01L 21/823864* (2013.01); *H01L 21/823871* (2013.01); *H01L 27/092* (2013.01); *H01L 29/04* (2013.01); *H01L 29/0676* (2013.01); *H01L 29/0847* (2013.01); *H01L 29/1037* (2013.01); *H01L 29/1054* (2013.01); *H01L 29/1095* (2013.01); *H01L 29/152* (2013.01); *H01L 29/165* (2013.01); *H01L 29/205* (2013.01); *H01L 29/267* (2013.01); *H01L 29/41741* (2013.01); *H01L 29/42376* (2013.01); *H01L 29/42392* (2013.01); *H01L 29/45* (2013.01); *H01L 29/6656* (2013.01); *H01L 29/66431* (2013.01); *H01L 29/66439* (2013.01); *H01L 29/66462* (2013.01); *H01L 29/66469* (2013.01); *H01L 29/66522* (2013.01); *H01L 29/66666* (2013.01); *H01L 29/66742* (2013.01); *H01L 29/775* (2013.01); *H01L 29/7788* (2013.01); *H01L 29/7827* (2013.01); *H01L 29/78642* (2013.01); *H01L 21/31053* (2013.01); *H01L 29/0649* (2013.01)

(58) Field of Classification Search
CPC .......... H01L 29/66666; H01L 29/7827; H01L 21/306; H01L 21/3065; H01L 21/3083; H01L 21/8221; H01L 21/823418; H01L 21/823487; H01L 21/823814; H01L 21/823885
See application file for complete search history.

(56) References Cited

U.S. PATENT DOCUMENTS

| | | | |
|---|---|---|---|
| 9,196,730 | B1 | 11/2015 | Yu et al. |
| 9,502,519 | B2* | 11/2016 | Chen .................. H01L 29/7827 |
| 9,799,655 | B1* | 10/2017 | Cheng ................ H01L 27/0924 |
| 10,020,396 | B2 | 7/2018 | Cantoro et al. |
| 2002/0076884 | A1 | 6/2002 | Weis |
| 2003/0215989 | A1 | 11/2003 | Kim et al. |
| 2011/0012085 | A1* | 1/2011 | Deligianni ............. B82Y 10/00 257/9 |
| 2012/0319201 | A1 | 12/2012 | Sun et al. |
| 2014/0175561 | A1 | 6/2014 | Colinge et al. |
| 2014/0264289 | A1 | 9/2014 | Chuang et al. |
| 2015/0017767 | A1 | 1/2015 | Masuoka et al. |
| 2015/0263094 | A1 | 9/2015 | Diaz et al. |
| 2016/0005850 | A1 | 1/2016 | Zhao et al. |
| 2016/0049397 | A1 | 2/2016 | Chang et al. |
| 2016/0064541 | A1* | 3/2016 | Diaz ................. H01L 29/66666 257/329 |
| 2016/0336324 | A1 | 11/2016 | Li et al. |
| 2018/0040740 | A1* | 2/2018 | Cantoro ......... H01L 21/823807 |
| 2018/0097065 | A1 | 4/2018 | Zhu |
| 2018/0097106 | A1 | 4/2018 | Zhu |
| 2018/0108577 | A1 | 4/2018 | Zhu et al. |

FOREIGN PATENT DOCUMENTS

| | | |
|---|---|---|
| CN | 1906769 A | 1/2007 |
| CN | 101017825 A | 8/2007 |
| CN | 101295647 A | 10/2008 |
| CN | 101399207 A | 4/2009 |
| CN | 101872778 A | 10/2010 |
| CN | 102412156 A | 4/2012 |
| CN | 103337519 A | 10/2013 |
| CN | 103515435 A | 1/2014 |
| CN | 103996709 A | 8/2014 |
| CN | 104701376 A | 6/2015 |
| CN | 105206670 A | 12/2015 |
| CN | 105280705 A | 1/2016 |
| CN | 105810720 A | 7/2016 |
| EP | 0899790 A2 | 3/1999 |
| KR | 20090066491 A | 6/2009 |

OTHER PUBLICATIONS

"U.S. Appl. No. 15/718,586, Corrected Notice of Allowability dated May 16, 2019", 4 pgs.
"U.S. Appl. No. 15/718,586, Non Final Office Action dated Jun. 26, 2019", 19 pgs.
"U.S. Appl. No. 15/718,586, Notice of Allowance dated May 6, 2019", 8 pgs.
"U.S. Appl. No. 15/718,586, Response filed Nov. 14, 2018 to Restriction Requirement dated Oct. 2, 2018", 9 pgs.
"U.S. Appl. No. 15/718,586, Response filed Apr. 3, 2019 to Non-Final Office Action dated Dec. 12, 2018", 12 pgs.
"U.S. Appl. No. 15/718,586, Restriction Requirement dated Oct. 2, 2018", 6 pgs.
"U.S. Appl. No. 15/720,240, Non Final Office Action dated Aug. 26, 2019", 14 pgs.
"U.S. Appl. No. 15/720,240, Response filed May 21, 2019 to Restriction Requirement dated Mar. 22, 2019", 10 pgs.
"U.S. Appl. No. 15/720,240, Restriction Requirement dated Mar. 22, 2019", 6 pgs.
"U.S. Appl. No. 15/722,423, Notice of Allowance dated Jun. 28, 2019", 8 pgs.
"Chinese Application Serial No. 201710530250.X, Office Action dated Apr. 3, 2019", w/ Concise Statement of Relevance, (dated Apr. 3, 2019), 8 pgs.

(56) References Cited

OTHER PUBLICATIONS

"Chinese Application Serial No. 201710530297.6, Office Action dated Aug. 28, 2019", w/ Concise Statement of Relevance, (dated Aug. 28, 2019), 8 pgs.

"Chinese Application Serial No. 201710530298.0, Office Action dated May 22, 2019", w/ Concise Statement of Relevance, (dated May 22, 2019), 12 pgs.

"Chinese Application Serial No. 201710530685.4, Office Action dated Aug. 28, 2019", w/ Concise Statement of Relevance, (dated Aug. 28, 2019), 8 pgs.

"Chinese Application Serial No. 201710531812.2, Office Action dated May 21, 2019", w/ Concise Statement of Relevance, (dated May 21, 2019), 12 pgs.

"U.S. Appl. No. 15/718,586, Non Final Office Action dated Dec. 12, 2018", 12 pgs.

"U.S. Appl. No. 15/722,423, Non Final Office Action dated Jan. 10, 2019", 8 pgs.

"U.S. Appl. No. 15/722,423, Notice of Allowance dated May 8, 2019", 7 pgs.

"U.S. Appl. No. 15/722,423, Response filed Nov. 14, 2018 to Restriction Requirement dated Oct. 18, 2018", 11 pgs.

"U.S. Appl. No. 15/722,423, Response filed Apr. 10, 2019 to Non-Final Office Action dated Jan. 10, 2019", 12 pgs.

"U.S. Appl. No. 15/722,423, Restriction Requirement dated Oct. 18, 2018", 6 pgs.

"Chinese Application Serial No. 201710530751.8 Office Action dated Oct. 9, 2019", w/no English translation, 6 pgs.

"U.S. Appl. No. 15/718,586, Response filed Sep. 26, 2019 to Non-Final Office Action dated Jun. 26, 2019", 9 pgs.

"U.S. Appl. No. 15/718,586, Final Office Action dated Nov. 14, 2019", 16 pgs.

"U.S. Appl. No. 15/722,423, Notice of Allowance dated Dec. 4, 2019", 8 pgs.

"Chinese Application Serial No. 201710530194.X, Office Action dated Nov. 25, 2019", (Nov. 25, 2019), 8 pgs.

"Chinese Application Serial No. 201710530250.X, Office Action dated Nov. 14, 2019", (Nov. 14, 2019), 7 pgs.

"Chinese Application Serial No. 201710530684.X, Office Action dated Nov. 4, 2019", (Nov. 4, 2019), 7 pgs.

"Chinese Application Serial No. 201710530950.9, Office Action dated Nov. 14, 2019", (Nov. 14, 2019), 7 pgs.

"Chinese Application Serial No. 201710531762.8, Office Action dated Nov. 4, 2019", (Nov. 4, 2019), 15 pgs.

"Chinese Application Serial No. 201710531811.8 , Office Action dated Oct. 24, 2019", w/ Concise Statement of Relevance, 9 pgs.

"U.S. Appl. No. 15/718,586, Advisory Action dated Feb. 3, 2020", 3 pgs.

"U.S. Appl. No. 15/718,586, Response filed Jan. 13, 2020 to Final Office Action dated Nov. 14, 2019", 11 pgs.

\* cited by examiner

IC UNIT AND METHOD OF MANUFACTURING THE SAME, AND ELECTRONIC DEVICE INCLUDING THE SAME

CROSS-REFERENCE TO RELATED APPLICATION(S)

This application claims priority to Chinese Application No. 201610872541.2, filed on Sep. 30, 2016, and also Chinese Application No. 201710530751.8, filed on Jun. 30, 2017, which are incorporated herein by reference in their entireties.

TECHNICAL FIELD

The present disclosure relates generally to the semiconductor field, and more particularly to an Integrated Circuit (IC) unit based on vertical devices, a method of manufacturing the same, and an electronic device including the IC unit.

BACKGROUND

A planar device, such as a Metal Oxide Semiconductor Field Effect Transistor (MOSFET), has its source, gate and drain arranged in a direction substantially parallel to a substrate surface. Due to such an arrangement, it is difficult for the planar device to have its footprint further scaled down or its manufacture cost further reduced. In contrast, a vertical device has its source, gate and drain arranged in a direction substantially perpendicular to the substrate surface. Therefore, it is relatively easier for the vertical device to be scaled down or reduced in manufacture cost, as compared to the planar device. Nanowire based Vertical Gate-all-around Field Effect Transistor (V-GAAFET) is a candidate for future high-performance devices.

However, for the V-GAAFET, it is difficult to control its gate length, especially for those with a single-crystalline channel material. This is because conventionally the gate length depends on timing etching, which is difficult to control. On the other hand, it is a great challenge in the Integrated Circuit (IC) industry to make an IC unit including stacked V-GAAFETs (especially those having different conductivity types) with high performances and small footprint.

SUMMARY

In view of the above, the present disclosure aims to provide, among others, an Integrated Circuit (IC) unit based on stacked vertical nanowire devices and a method of manufacturing the same, and also an electronic device including the IC unit.

According to an aspect of the present disclosure, there is provided an IC unit, including: a first source/drain layer, a channel layer and a second source/drain layer for a first device and a first source/drain layer, a channel layer and a second source/drain layer for a second device stacked in sequence on a substrate, wherein in the first device, the channel layer comprises a first portion and a second portion separated from each other, the first source/rain layer and the second source/drain layer each extend integrally to overlap both the first portion and the second portion of the channel layer; a first gate stack surrounding a periphery of the first portion and also a periphery of the second portion of the channel layer of the first device; and a second gate stack surrounding a periphery of the channel layer of the second device.

According to a further aspect of the present disclosure, there is provide a method of manufacturing an Integrated Circuit (IC) unit, including: providing a stack of a first source/drain layer, a channel layer and a second source/drain layer for a first device and a first source/drain layer, a channel layer and a second source/drain layer for a second device on a substrate; selectively etching the channel layer of the second device and the channel layer of the first device, so that the channel layer of the second device has its periphery recessed inwards with respect to that of the first and second source/drain layers of the second device, and that the channel layer of the first device has its periphery recessed inwards with respect to that of the first and second source/drain layers of the first device and is separated into a first portion and a second portion spaced apart from each other; and forming a first gate stack and a second gate stack to surround the periphery of the respective channel layers of the first device and the second device, respectively.

According to a further aspect of the present disclosure, there is provided an electronic device comprising an IC having the IC unit as described above.

According to embodiments of the present disclosure, the channel layer may be implemented as a nanowire. The source/drain layers may be provided on upper and lower ends of the nanowire, and the gate stack may surround the periphery of the channel layer, resulting in a nanowire based Vertical Gate-all-around Field Effect Transistor (V-GAAFET). Several nanowire based V-GAAFETs (of different conductivity types) may be vertically stacked, to improve integration degree. A channel is formed in the channel layer, and thus the gate length is substantially determined by the thickness of the channel layer. The channel layer may be grown by epitaxy, and thus can have its thickness well controlled. Therefore, it is possible to well control the gate length.

BRIEF DESCRIPTION OF THE DRAWINGS

The above and other objects, features, and advantages of the present disclosure will become more apparent from following descriptions on embodiments thereof with reference to attached drawings, in which.

Throughout the drawings, like or similar reference numerals denote like or similar elements.

DETAILED DESCRIPTION

Figure 1A:
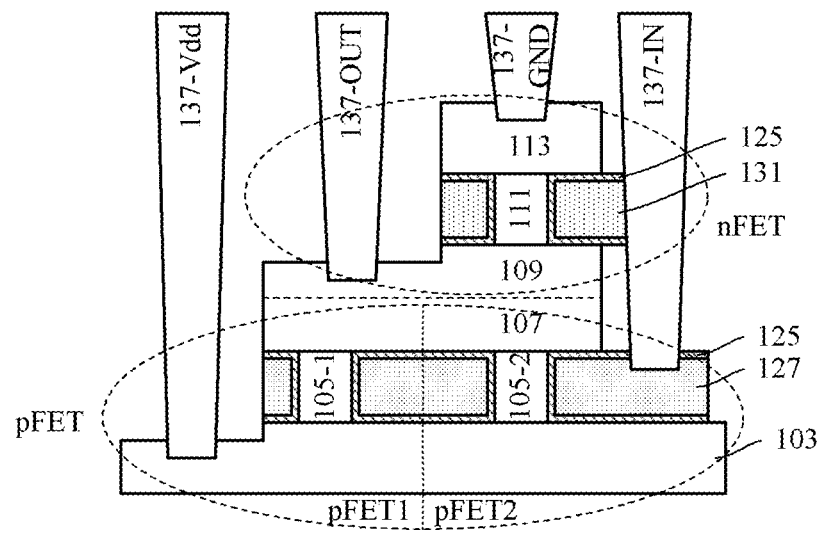
FIG. 1(a) is a simplified structural diagram showing an Integrated Circuit (IC) unit according to an embodiment of the present disclosure.

Hereinafter, descriptions are given with reference to embodiments shown in the attached drawings. However, it is to be understood that these descriptions are illustrative and not intended to limit the present disclosure. Further, in the following, known structures and technologies are not described to avoid obscuring the present disclosure unnecessarily.

In the drawings, various structures according to the embodiments are schematically shown. However, they are not drawn to scale, and some features may be enlarged while some features may be omitted for sake of clarity. Moreover, shapes and relative sizes and positions of regions and layers shown in the drawings are also illustrative, and deviations may occur due to manufacture tolerances and technique limitations in practice. Those skilled in the art can also devise regions/layers of other different shapes, sizes, and relative positions as desired.

In the context of the present disclosure, when a layer/element is recited as being "on" a further layer/element, the layer/element can be disposed directly on the further layer/element, or otherwise there may be an intervening layer/element interposed therebetween. Further, if a layer/element is "on" a further layer/element in an orientation, then the layer/element can be "under" the further layer/element when the orientation is turned.

FIG. 1(a) is a simplified structural diagram showing an Integrated Circuit (IC) unit according to an embodiment of the present disclosure.

As shown in FIG. 1(a), the IC unit 100 according to this embodiment is based on vertical devices stacked vertically. In this example, it is exemplified that devices of different conductivity types, such as a pFET and an nFET, are stacked. However, the present disclosure is not limited thereto. For example, devices of the same conductivity type can be stacked. In the example of FIG. 1(a), the nFET is stacked on the pFET. However, the present disclosure is not limited thereto. For example, the pFET may be stacked on the nFET. Here, each of the vertical devices may include a first source/drain layer, a channel layer, and a second source/drain layer sequentially stacked (on a substrate). The respective layers may be contiguous to each other, or alternatively may have some other semiconductor layer(s) interposed therebetween, for example, a leakage suppression layer or an ON-current enhancement layer (a semiconductor layer having a band gap greater or smaller than that of an adjacent one). Specifically, the pFET may include a first p-device source/drain layer 103, a p-device channel layer 105-1, 105-2, and a second p-device source/drain layer 107, and the nFET may include a first n-device source/drain layer 109, an n-device channel layer 111, and a second n-device source/drain layer 113. In the following descriptions, the "channel layer" and the "first/second source/drain layer" refer to those for one same device while being recited together, unless otherwise indicated.

For each of the devices, source/drain regions may be formed in the first source/drain layer and the second source/drain layer, and a channel region may be formed in the channel layer. A conductive channel may be formed between the source/drain regions on opposite ends of the channel region through the channel region. A gate stack may be formed to surround the channel layer. Specifically, the gate stack for the pFET (including a gate dielectric layer 125 and a gate conductor layer 127) may surround the p-device channel layer 105-1, 105-2, and the gate stack for the nFET (including the gate dielectric layer 125 and a gate conductor layer 131) may surround the n-device channel layer 111. Here, the channel layer may be in a form of nanowire, resulting in a nanowire based Verticial Gate-all-around Field Effect Transistor (V-GAAFET) device. Further, in this example the nFET and the pFET have the same gate dielectric layer 125. However, the present disclosure is not limited thereto. For example, they may have different gate dielectric layers.

As a result, a gate length may be determined substantially by the thickness of the channel layer itself, instead of the timing etching as in the conventional art. The channel layer may be formed by, for example, epitaxy, and thus can have its thickness well controlled. Therefore, it is possible to well control the gate length. Since the respective layers may be grown separately (and thus at least one pair of adjacent ones may have a relatively clear crystalline interface therebetween), it is possible to select materials for the respective layers in a relatively flexible way. For example, it is possible to select different materials for the nFET and pFET or to select new materials such as Ge or III-V group materials to improve the device performances. Further, the respective layers may be doped separately, so that at least one pair of adjacent ones may have a doping concentration interface therebetween.

The channel layer may have its periphery recessed with respect to that of the first and second source/drain layers. In this way, the gate stack may be embedded into the recess of the channel layer with respect to the first and second source/drain layers. This can reduce or even avoid overlap of the gate stack with the source/drain regions, and help reducing parasitic capacitance between the gate and the source/drain.

The channel layer may be made of a single-crystalline material, to improve the device performances. Certainly, the first and second source/drain layers may also be made of a single-crystalline material. In this case, the single-crystalline material for the channel layer and the single-crystalline material for the source/drain layers may have the same crystal structure.

According to embodiments of the present disclosure, the channel layer may include a semiconductor material different from that of the first and second source/drain layers. This facilitates processing, such as selective etching, of the channel layer so that it can be relatively recessed with respect to the first and second source/drain layers. Further, the first and second source/drain layers may include the same semiconductor material. Furthermore, the channel layer of the pFET and the channel layer of the nFET may include the same semiconductor material, and the source/drain layers of the pFET and the source/drain layers of the nFET may include the same semiconductor material.

To save footprint, an upper one of the devices (the nFET in this example) may be stacked completely above a lower one (the pFET in this example). That is, an outline of the upper one (especially an active region thereof) does not go beyond that of the lower one (especially an active region thereof) in a top view.

In this example, two pFET devices (pFET1 and pFET2 as shown in FIG. 1(a)) and one nFET device are provide to provide a symmetrical circuit design, taking the difference in driving capability of the nFET and pFET into account (the mobility of electrons is generally two times greater than that of holes). The two pFET devices pFET1 and pFET2 are connected to each other by sharing the first source/drain layer 103 and the second source/drain layer 107, and they also share the common gate stack 125/127. As a result, the two pFET devices pFET1 and pFET2 operate as a single pFET (and thus they are shown as pFET as a whole in the following descriptions), with driving capability two time greater than that of one single pFET (and thus substantially the same as that of one single nFET).

Since two pFET devices are to be provided, the p-device channel layer includes the two portions 105-1 and 105-2 separated from each other (which may have substantially the same size), to provide two channels. In this case, the pFET has its active region greater in area than that of the nFET. Thus, in this example the pFET is provided as a lower one and the nFET is stacked on the pFET. This makes it possible that contacts occupy no additional area, which will be described in more detail in the following.

Figure 1B:
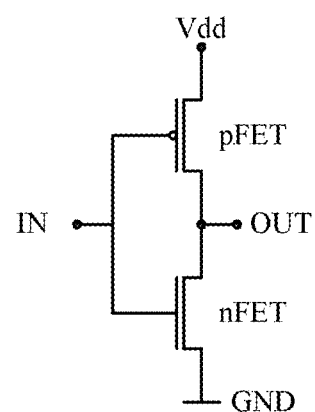
FIG. 1(b) is a circuit diagram showing a situation where an IC unit operates as an inverter according to an embodiment of the present disclosure.

The channel layer 111 of the nFET may be substantially aligned to one of the two portions 105-1 and 105-2 of the channel layer of the pFET (the one on the right side 105-2 in this example shown in FIG. 1(*a*)) in a vertical direction. The other one of the channel layer of the pFET (the one on the left side 105-1 in this example shown in FIG. 1(*a*)) is laterally offset with respect to the channel layer 111 of the nFET.

The second source/drain layer 107 of the pFET and the first source/drain layer 109 of the nFET overlap with each other, and may be electrically connected to each other connected (by, for example, direct physical contact in this example). Therefore, the pFET and the mFET are connected in series. Since the second source/drain layer 107 of the pFET and the first source/drain layer 109 of the nFET may include the same semiconductor material (but doped differently), an interface between those two layers is indicated by a dashed line in FIG. 1(*a*), though they might be integral with each other. For better electrical connection, the first source/drain layer 109 of the nFET may extend on substantially an entire top surface of the second source/drain layer 107 of the pFET. For example, the first source/drain layer 109 of the nFET may have its periphery substantially coinciding with that of the second source/drain layer 107 of the pFET (in the top view).

To make a contact 137-OUT to the first source/drain layer 109 of the nFET (and also to the second source/drain layer 107 of the pFET) in a relatively easy way, the first source/drain layer 109 of the nFET (and also the second source/drain layer 107 of the pFET) may protrude with respect to overlying functional layers (the respective layers in the active region, the gate stack, or the like), especially the second source/drain layer 113 of the nFET. Since the second source/drain layer 113 of the nFET is positioned above the channel layer 111 of the nFET (and thus positioned above the channel layer 105-2 of the pFET in the case where the channel layer 111 of the nFET is substantially aligned to the channel layer 105-2 of the pFET) while the first source/drain layer 109 of the nFET (and also the second source/drain layer 107 of the pFET) needs to extend onto the channel layer 105-1 of the pFET, the first source/drain layer 109 of the nFET (and also the second source/drain layer 107 of the pFET) may protrude in a direction towards the channel layer 105-1 of the pFET (towards the left side in FIG. 1(*a*)) with respect to the second source/drain layer 113 of the nFET. In this way, there is no need for an additional area to provide such a protrusion. Thus, the contact 137-OUT may be positioned above the first source/drain layer 109 of the nFET (and also the second source/drain layer 107 of the pFET), without occupying any additional area.

Similarly, to make a contact 137-Vdd to the first source/drain layer 103 of the pFET in a relatively easy way, the first source/drain layer 103 of the pFET may protrude (towards the left side in FIG. 1(*a*)) with respect to overlying functional layers, especially the especially the second source/drain layer 107 of the pFET (and also the first source/drain layer 109 of the nFET). Thus, the contact 137-Vdd may be positioned above the first source/drain layer 103 of the pFET, without occupying any additional area.

Likewise, to make a contact 137-IN to the gate stacks in a relatively easy way, the gate stack 125/131 of the nFET may protrude (towards the right side in FIG. 1(*a*)) with respect to overlying functional layers, especially the second source/drain layer 113 of the nFET, and similarly the gate stack 125/127 of the pFET may protrude with respect to overlying functional layers, especially the second source/drain layer 113 of the nFET, the first source/drain layer 109 of the nFET, and the second source/drain layer 107 of the pFET. To avoid interference with the contact 137-OUT, the gate stacks may protrude in a direction (towards the right side in FIG. 1(*a*)) different from, for example, opposite to, a direction in which the first source/drain layer 109 of the nFET and the second source/drain layer 107 of the pFET protrude with respect to the second source/drain layer 113 of the nFET. In this way, the contact 137-IN may be positioned above the gate stacks, without occupying any additional area. In this example, the gate stack of the nFET and the gate stack of the pFET are electrically connected together, and thus share the common contact 137-IN.

Further, in this IC unit, since the second source/drain layer 113 of the nFET is the uppermost one in the active region, a contact 137-GND to the second source/drain layer 113 of the nFET may be provided on the second source/drain layer 113 of the nFET, without occupying any additional area.

Therefore, in this IC unit 100, all the contacts 137-Vdd, 137-GND, 137-IN, and 137-OUT can share the footprint with the V-GAAFET of the IC unit 100, without occupying any additional area. It is possible to save the area by about 30-40% as compared to Complementary Metal Oxide Semiconductor (CMOS) made in a conventional way.

FIG. 1(*b*) is a circuit diagram showing a situation where the IC unit of FIG. 1(*a*) operates as an inverter.

As described above, the nFET and the pFET is connected in series, and their gates are connected together to receive an input signal IN through the contact 137-IN. One of the source/drains of the pFET may receive a supply voltage through the contact 137-Vdd, and one of the source/drains of the nFET may be connected to the ground through the contact 137-GND. The source/drains of the pFET and nFET connected together may output an output signal OUT through the contact 137-OUT. The output signal OUT is an inverted version of the input signal IN. thus, this IC circuit functions as an inverter in such a connection layout.

Certainly, such an IC unit of the nFET and the pFET connected in series is not limited to an inverter, but can serve as other functional component or a constituent part of a functional component.

Such an IC unit can be manufactured as follows. Specifically, a stack of a first p-device source/drain layer, a p-device channel layer and a second p-device source/drain layer and a first n-device source/drain layer, an n-device channel layer and a second n-device source/drain layer may be provided on a substrate (which will result in a configuration where an nFET is stacked on a pFET). Certainly, the respective layers for the n-type device may be provided on a lower side, while the respective layers for the p-type device may be provided an upper side (which will result in a configuration where a pFET is stacked on an nFET, in which case the following descriptions on the p-type and n-type can be exchanged). As described above, the respective layers may be grown by epitaxy. Those layers, especially the channel layers, may have their respective thickness controlled during the epitaxy.

Further, the source/drain layers may be doped in situ while being grown. Optionally, the channel layers may be doped in situ.

An active region may be defined in the provided stack. In defining the active region, at least some layers of the stack may be selectively etched into a desired shape. For example, the n-device channel layer and the p-device channel layer may be selectively etched so that the n-device channel layer has its periphery recessed inwards with respect to that of the first and second n-type source/drain layers, and that the p-device channel layer has its periphery recessed inwards with respect to that of the first and second p-type source/drain layers and is separated into a first portion and a second portion spaced apart from each other. Those recesses can define spaces for accommodating gate stacks. Then, an n-device gate stack and a p-device gate stack may be formed to surround the periphery of the n-device channel layer and the periphery of the n-device channel layer, respectively.

As described above, for convenience of making the contacts, the second n-device source/drain layer may be selectively etched so that the second n-device source/drain layer, which is the uppermost one of the stack, has a reduced area with respect to the remaining source/drain layers (that is, the remaining source/drain layers protrude with respect to the second n-device source/drain layer), and thus will not impede manufacture of the contacts to the remaining source/drain layers. The n-device channel layer may be selectively etched so that it is recessed with respect to the etched second n-device source/drain layer.

Similarly, as described above, for convenience of making the contacts, the first n-device source/drain layer and the second p-device source/drain layer may be selectively etched, so that they protrude with respect to the etched second n-device source/drain layer, but has a reduced area with respect to the first p-device source/drain layer. In this way, on one hand it is convenient to make the contact to the first n-device source/drain layer and the second p-device source/drain layer, and on the other hand it is possible not to impede manufacture of the contact to the first p-device source/drain layer.

Further, to make the gate stacks that protrude and thus cause convenience in the manufacture of the contacts as described above, the replacement gate technique can be used. For example, sacrificial gates may be formed in the recesses of the respective channel layers, respectively. Then, the second p-device source/drain layer and the first and second n-device source/drain layers may be further selectively etched to have their areas reduced, so that the respective sacrificial gates protrude with respect to their respective overlying active layers. After that, the sacrificial gates may be replaced with the respective gate stacks for the n-type device and the p-type device. Since the resultant gate stacks for the n-type device and the p-type device occupy the locations of the respective sacrificial gates and thus protrude with respect to their respective overlying active layers, it is relatively easy to make the contacts thereto.

The technology of the present disclosure can be implemented in various ways, some of which are exemplified in the following with reference to the drawings.

FIGS. 2-15 are schematic views showing a flow of manufacturing an IC circuit according to an embodiment of the present disclosure.

Figure 2:
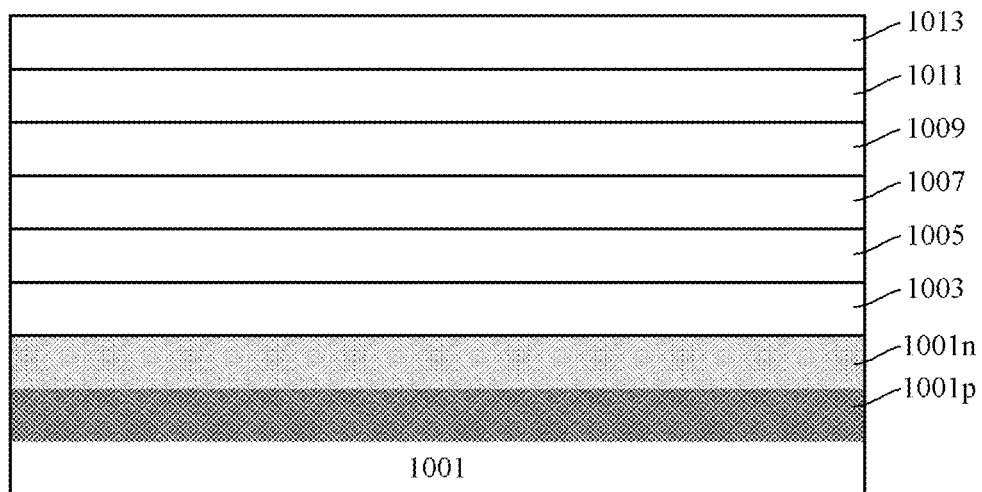
FIGS. 2-15 are schematic views showing a flow of manufacturing an IC unit according to an embodiment of the present disclosure.

As shown in FIG. 2, a substrate 1001 is provided. The substrate 1001 may be a substrate in any form, for example, but not limited to, a bulk semiconductor substrate such as a bulk silicon (Si) substrate, a Semiconductor on Insulator (SOI) substrate, a compound semiconductor substrate such as a SiGe substrate, or the like. Hereinafter, the bulk Si substrate will be described by way of example for convenience of description.

If a p-type device is firstly made on the substrate 1001 and then an n-type device is stacked on the p-type device, then a configuration where a p-type well 1001$p$ is provide on a lower side and an n-type well 1001$n$ is provided on an upper side may be formed in the substrate 1001. For example, p-type impurities such as B or $BF_2$ and n-type impurities such as P or As may be implanted into the substrate 1001 by ion implantation, to form the p-type well 1001$p$ and the n-type well 1001$n$, respectively. The p-type well 1001$p$ may have the impurities at a concentration of about 1E17-1E20 $cm^{-3}$, and the n-type well 1001$n$ may have the impurities at a concentration of about 1E17-2E18 $cm^{-3}$.

If an n-type device is firstly made on the substrate 1001 and then a p-type device is stacked on the n-type device, then a configuration where a p-type well 1001$p$ is provide on an upper side and an n-type well 1001$n$ is provided on a lower side may be formed in the substrate 1001. In this case, the p-type well 1001$p$ may have the impurities at a concentration of about 1E17-2E18 $cm^{-3}$, and the n-type well 1001$n$ may have the impurities at a concentration of about 1E17-1E20 $cm^{-3}$.

Alternatively, a p-doped semiconductor layer 1001$p$ and an n-doped semiconductor layer 1001$n$ may be further formed on the substrate. For example, those semiconductor layers may be grown by epitaxy, and doped in situ or by ion implantation.

The p-type well 1001$p$ and the n-type well 1001$n$ can provide electric isolation later.

In the following, a configuration where the p-type device is firstly made and then the n-type device is stacked thereon is described by way of example.

On the substrate 1001, active material layers for the p-type device, i.e., a first p-device source/drain layer 1003, a p-device channel layer 1005, a second p-device source/drain layer 1007, and also active material layers for the n-type device, i.e., a first n-device source/drain layer 1009, an n-device channel layer 1011, and a second n-device source/drain layer 1013 are formed in sequence by, for example, epitaxy. For example, the respective source/drain layers may include the same semiconductor material such as SiGe (with an atomic percentage of Ge being about 20-35%), and the respective channel layers may include the same semiconductor material, but different from that of the source/drain layers, such as Si. Certainly, the present disclosure is not limited thereto. For example, the p-device source/drain layers may include the same semiconductor material, but different from that of the n-device source/drain layers; the n-device source/drain layers may include the same semiconductor material, but different from that of the p-device source/drain layers; the n-device channel layer may include a semiconductor material different from that of the p-device channel layer. Here, the materials are selected so that the channel layers and the source/drain layers have etching selectively with respect to each other, that is, one can be etched while without substantial impact on the other.

Each of the channel layers and the source/drain layers may have a suitable thickness, for example, about 20-40 nm. Here, the p-device channel layer 1005 and the n-device channel layer 1011 may have substantially the same thickness, so that the n-type device and the p-type device can provide substantially the same gate length.

The respective source/drain layers may be doped at suitable conductivity type. For example, the p-device source/drain layers may be p-type doped at a concentration of about 1E18-1E20 cm$^{-3}$, and the n-device source/drain layers may be n-type doped at a concentration of about 1E18-1E20 cm$^{-3}$. This may be done by doping in situ with p-type impurities such as B or BF$_2$ or n-type impurities such as As or P during epitaxy.

Further, the channel layers may be doped or not doped as desired. The p-device channel layer 1005 may be n-type lightly doped at a concentration of about 1E17-2E18 cm$^{-3}$, and the n-device channel layer 1011 may be p-type lightly doped at a concentration of about 1E17-2E18 cm$^{-3}$.

The p-type doped first p-device source/drain layer 1003 and the underlying n-type well 1001n and p-type well 1001p constitute a pnp structure to provide electrical isolation.

Next, the active material layers may be patterned to define active regions for the devices. As described above, the p-type device and the n-type device may have their respective active regions of different areas, taking the difference in driving capacity between the n-type device and the p-type device. The active regions may be defined separately for the p-type device and the n-type device.

Figure 3A:
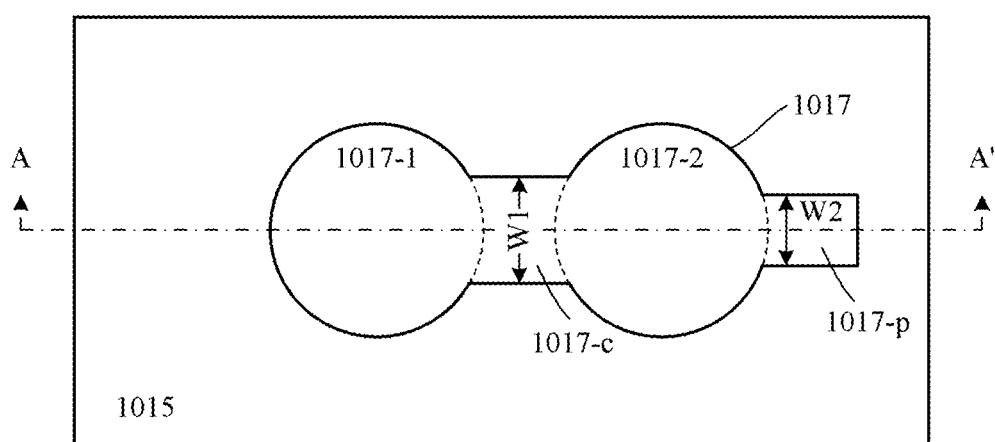
Figure 3B:
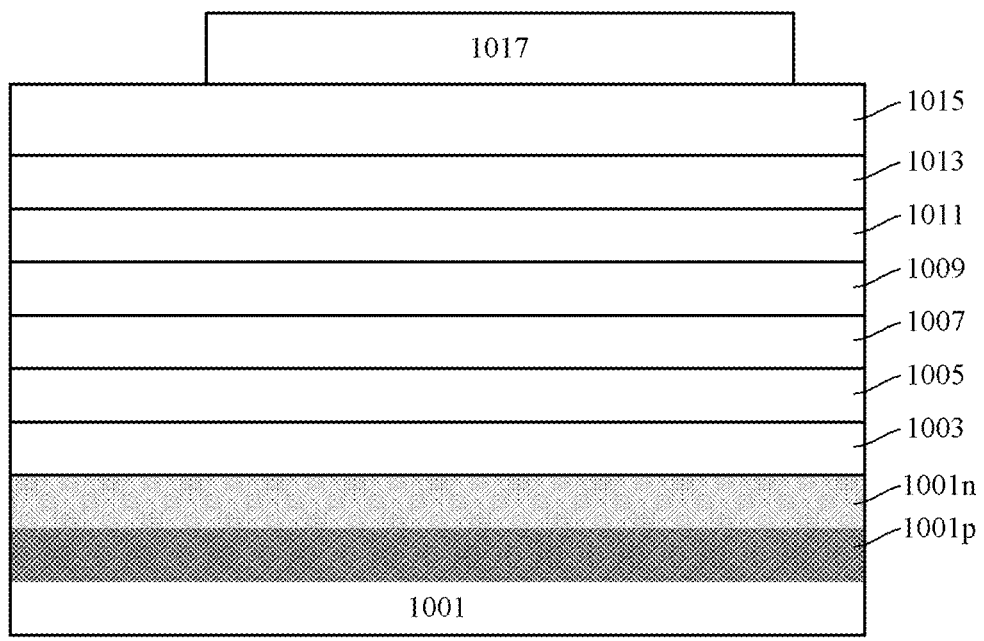

For example, as shown in FIGS. 3(a) and 3(b) (FIG. 3(a) is a top view, and FIG. 3(b) is a sectional view taken along line AA' in FIG. 3(a)), a dielectric layer 1015 may be formed on the structure shown in FIG. 2. The dielectric layer 1015 may protect the active material layers and also serve as a (etching/planarizing) stop layer, a mask layer, or the like in the following process. For example, the dielectric layer 1015 may include nitride (e.g., silicon nitride), with a thickness of about 50-150 nm. On the dielectric layer 1015, a mask such as photoresist 1017 may be formed for patterning the active material layers for the p-type device. The photoresist 1017 may be patterned by photolithography (exposing and developing) into a shape having a first main-body portion 1017-1 and a second main-body portion 1017-2. Those main-body portions can be used to define locations of the channel layers, and thus have shapes corresponding to desired shapes of the channel layers. For example, in a case where a nanowire channel layer is to be formed, the main-body portion may have a circular shape (which then will result in a channel layer with a section in a substantially circular shape). Certainly, the present disclosure is not limited thereto. Other shapes, for example, polygon, are also possible. Further, the first main-body portion 1017-1 and the second main-body portion 1017-2 may have substantially the same size (for example, substantially the same radius).

There may be a connection portion 1017-c between the first main-body portion 1017-1 and the second main-body portion 1017-2. The connection portion 1017-c extends from the first main-body portion 1017-1 to the second main-body portion 1017-2. The connection portion 1017-c may have its longitudinal axis coinciding with a line connecting centers of the first main-body portion 1017-1 and the second main-body portion 1017-2. The presence of the connection portion 1017-c can guarantee that the second p-device source/drain layer 1007 keeps extending integrally, while not being separated into spaced apart portions in the following patterning.

Further, there is still an extending portion 1017-p extending outwards from a periphery of the second main-body portion 1017-2. The extending portion 1017-p can be used to define a protrusion for a gate stack in the following process. The extending portion 1017-p may have its longitudinal axis coinciding with the longitudinal axis of the connection portion 1017-c. However, the present disclosure is not limited thereto. Here, the connection portion 1017-c may have a line width W1 greater than a line width W2 of the extending portion 1017-p. However, the line width W1 of the connection portion 1017-c is preferably less than that of the main-body portions 1017-1, 1017-2 (e.g., diameter), so that the channel layers are predominantly determined by the main-body portions 1017-1, 1017-2, instead of the connection portion 1017-c. Specifically, for one material layer whose shape is defined by this mask, when this material layer is isotropically etched from its periphery, this material layer will have a portion thereof corresponding to the extending portion 1017-p (with the smallest dimension) removed firstly, and then a further portion thereof corresponding to the connection portion 1017-c (with the medium dimension) removed, and finally two separate portions corresponding to the main-body portions (with the greatest dimension) left as the etching goes on.

Thus, the photoresist 1017 may look like a gourd.

Figure 4A:
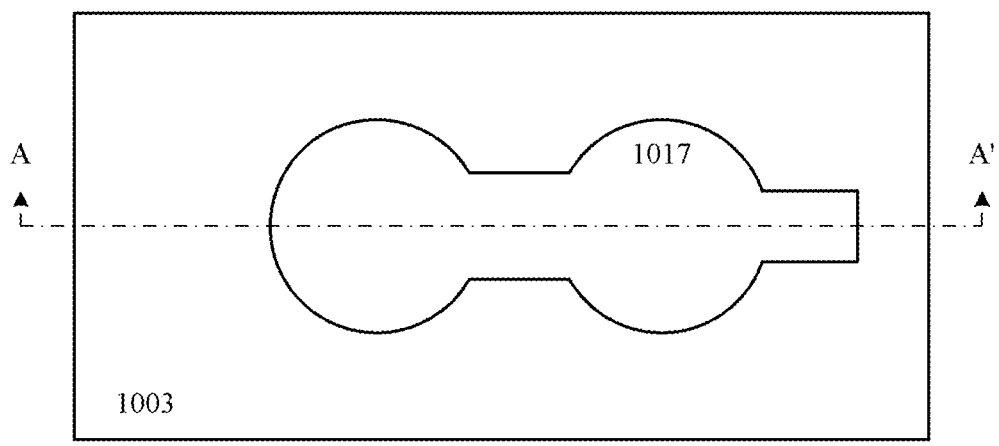
Figure 4B:
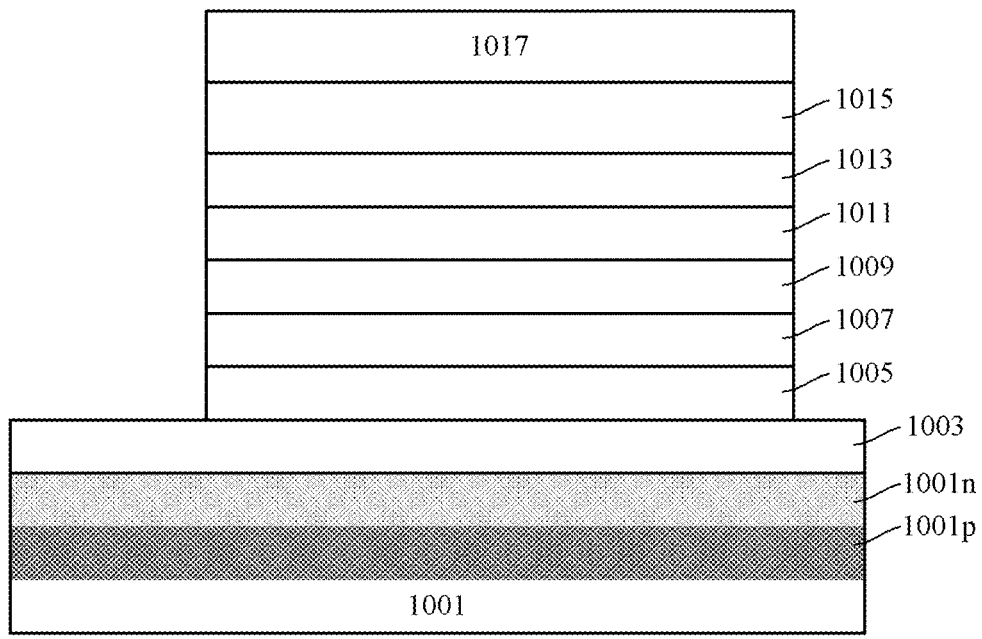

The gourd-like photoresist 1017 may be used to define the active region for the p-type device. For example, as shown in FIGS. 4(a) and 4(b) (FIG. 4(a) is a top view, and FIG. 4(b) is a sectional view taken along line AA' in FIG. 4(a)), the shape of the photoresist 1017 may be transferred to the underlying material layers, especially, the active material layers for the p-type device. For example, the dielectric layer 1015, the second n-device source/drain layer 1013, the n-device channel layer 1011, the first n-device source/drain layer 1009, the second p-device source/drain layer 1007, and the p-device channel layer 1005 may be patterned in sequence by Reactive Ion Etching (RIE) in a direction substantially perpendicular to a surface of the substrate, with the photoresist 1017 as a mask. The etching can be stopped at the first p-device source/drain layer 1003. All those patterned layers will present the same gourd shape as the photoresist 1017, and accordingly each have a first main-body portion and a second main-body portion, a connection portion between the first and second main-body portions, and also an extending portion extending outwards from an periphery of the second main-body portion. Here, the first p-device source/drain layer 1003, which is the lowermost one of the active material layers, may not be patterned, because its shape will not impact the formation of the devices above it.

Figure 5A:
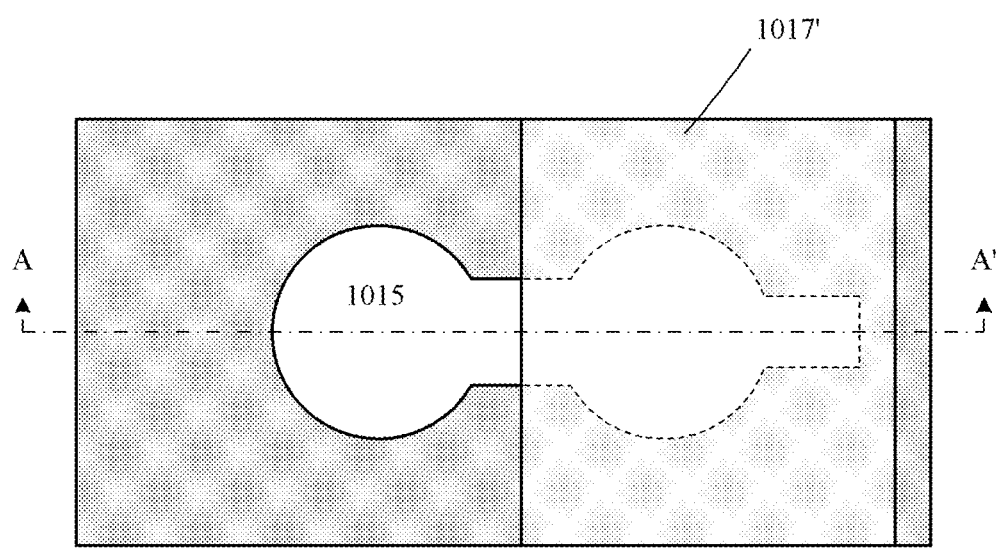
Figure 5B:
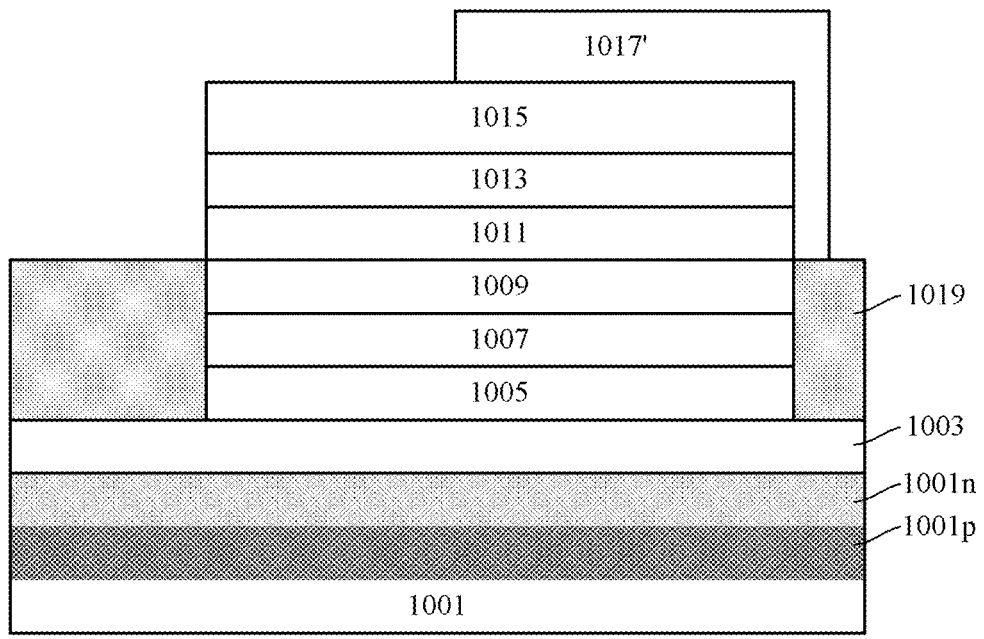

Next, the active region may be defined for the n-type device. To do this, as shown in FIGS. 5(a) and 5(b) (FIG. 5(a) is a top view, and FIG. 5(b) is a sectional view taken along line AA' in FIG. 5(a)), a protective layer 1019 may be formed on the substrate, to protect the active material layers for the p-type device. For example, the protective layer 1019 may include oxide. For example, the photoresist 1017 may be removed, and then the oxide may be deposited on the substrate and then planarized by, for example, Chemical Mechanical Polishing (CMP). The CMP may be stopped at the dielectric layer 1015. Then, the oxide may be etched back to form the protective layer 1019. Here, the protective layer after being etched back may have its top surface at a level close to a bottom surface of the n-device channel layer 1011. Thus, the active material layers 1005, 1007 for the p-type device may have their side walls covered so as to be protected from the later etching. Further, in this example, the first n-device source/drain layer 1019 may also have its side walls covered (perhaps with some portion thereof exposed, because, for example, the top surface of the protective layer 1019 is slightly lower than the bottom surface of the n-device channel layer 1011). Thus, the first n-device source/drain layer 1019 may have its outline substantially aligned to (coinciding with in the top view) that of the second p-device source/drain layer 1007 in the following process.

Subsequently, a shielding layer such as photoresist 1017' may be formed on the dielectric layer 1015. The photoresist 1017' may be patterned to cover the second main-body portion and also the extending portion (and optionally at least a fraction of the connection portion, for example, substantially a half of the connection portion as shown in FIGS. 5(*a*) and 5(*b*)) of the dielectric layer 1015 (which has already been patterned into the same gourd shape as the photoresist 1017).

Figure 6A:
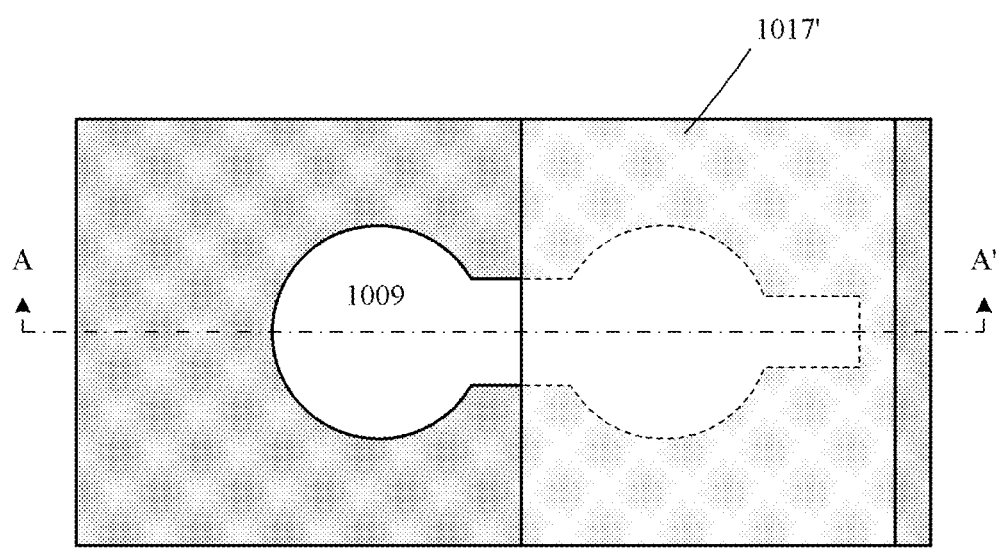
Figure 6B:
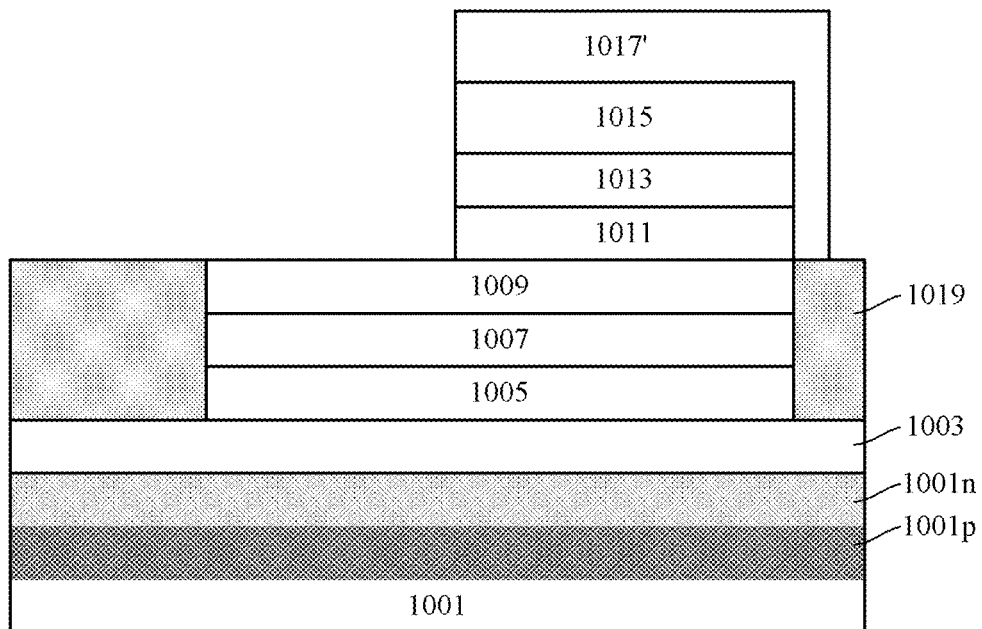

The portions of the dielectric layer 1015 covered by the photoresist 1017' may be used to define the active region for the n-type device. For example, as shown in FIGS. 6(*a*) and 6(*b*) (FIG. 6(*a*) is a top view, and FIG. 6(*b*) is a sectional view taken along line AA' in FIG. 6(*a*)), the shape of the portions of the dielectric layer 1015 covered by the photoresist 1017' may be transferred to the underlying material layers, especially the active material layers for the n-type device. For example, the dielectric layer 1015, the second n-device source/drain layer 1013, and the n-device channel layer 1011 may be patterned in sequence by RIE in a direction substantially perpendicular to the substrate surface, with the photoresist 1017' as a mask. As described above, to make the first n-device source/drain layer 1009 be in consistent and uniform contact with the second p-device source/drain layer 1007, the first n-device source/drain layer 1009 and the second p-device source/drain layer 1007 can be patterned in one same way. Also, the first n-device source/drain layer 1009 is the lowermost one of the active material layers for the n-type device, and will not impact the formation of the n-type device above it. Therefore, the etching may be stopped at the first n-device source/drain layer 1009. All those patterned layers present the same shape as that of the portions of the dielectric layer 1015 covered by the photoresist 1017', and accordingly each have a main-body portion (corresponding to the second main-body portion of the photoresist 1017) and also protruding portions protruding from opposite sides of the main-body portion (corresponding to the extending portion and some of the connection portion of the photoresist 1017).

Figure 7A:
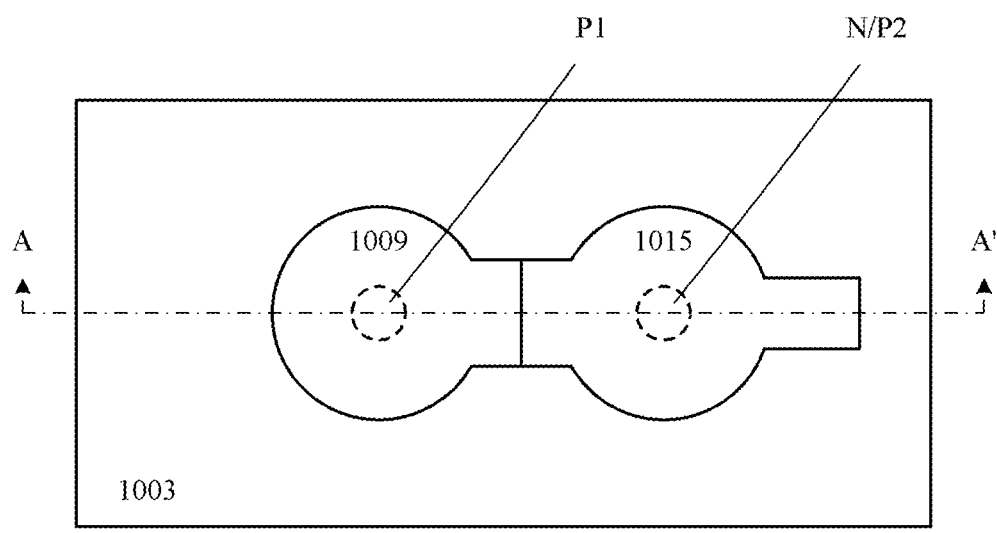
Figure 7B:
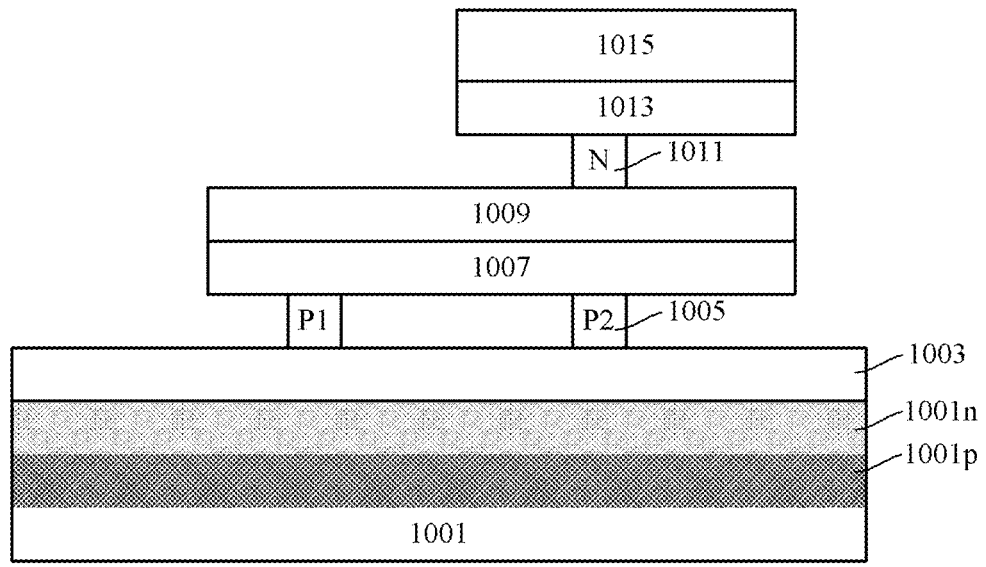

After that, the photoresist 1017' and the protective layer 1019 may be removed, to expose the respective active material layers, so that the channel layers may be further patterned to define spaces for gate stacks. For example, as shown in FIGS. 7(*a*) and 7(*b*) (FIG. 7(*a*) is a top view, and FIG. 7(*b*) is a sectional view taken along line AA' in FIG. 7(*a*)), a periphery of the channel layer may be recessed (in this example, in a lateral direction substantially parallel to the substrate surface) with respect to that of the source/drain layers. For example, this can be achieved by further selectively etching the channel layer 1005, 1011 of the Si material with respect to the source/drain layers 1003, 1007, 1009, 1013 of the SiGe material.

Here, isotropic etching may be used. The n-device channel layer 1011 presents the same shape as that of the portions of the dielectric layer 1015 covered by the photoresist 1017' (having the main-body portion in an island shape, with the protrusions on opposite sides). The etching may be conducted isotropically from the periphery of this shape inwards. Since the island shaped main-body portion has its line width greater than that of the protrusions on the opposite sides, the protrusions will be firstly etched away over time, and the etching goes on inwards predominantly along the periphery (in a circular shape in this example) of the island shaped main-body portion. Due to the isotropic etching, an etching interface will still present substantially the same shape as the periphery of the island shaped main-body portion (with some protrusions on opposite sides, which will become more trivial over time). Finally, the left channel layer 1011 may be centered substantially at the center of the island shaped main-body portion, and have its periphery in substantially the same shape as that of the island shaped main-body portion (but with a reduced size). In the case of the circular shape in this example, the resultant channel layer 1011 may be a circle substantially concentric with the island shaped main-body portion, as shown by the dashed line circuit indicated by "N" in FIG. 7(*a*).

Similarly, in the gourd shaped p-device channel layer 1005, the line width of the island shaped first and second main-body portions is greater than that of the connection portion and the extending portion. As a result, as the etching goes on, the connection portion and the extending portion will be etched away, and the etching will go on inwards predominantly along the periphery (in a circular shape in this example) of the first and second main-body portions. Finally, the left channel layer 1005 may be divided into portions which are centered substantially at the center of the first and second main-body portions, respectively, and have their respective periphery in substantially the same shape as that of the first and second main-body portions (but with a reduced size). In the case of the circular shape in this example, the channel layer 1005 is finally separated into two portions P1 and P2, which are circles substantially concentric with the first and second main-body portions, respectively, as shown by the dashed line circuits indicated by "P1" and "P2" in FIG. 7(*a*).

Further, N and P2 may be substantially aligned to each other vertically (and thus are shown as coinciding with each other in the top view of FIG. 7(*a*)).

The resultant channel layers N, P1, and P2 each may present a pillar (cylindrical) shape, with a diameter of about 5-50 nm, or about two thirds of the thickness of the channel layer. Thus, the channel layers N, P1, and P2 each may be a nanowire. To well control the diameter of the channel layers N, P1, and P2, Atomic Layer Etch (ALE) or Digital Etch may be used. Such an etching technique controls the amount of etching precisely by varying the number of etching cycles.

Thus, the active region for the IC unit is defined.

Figure 8:
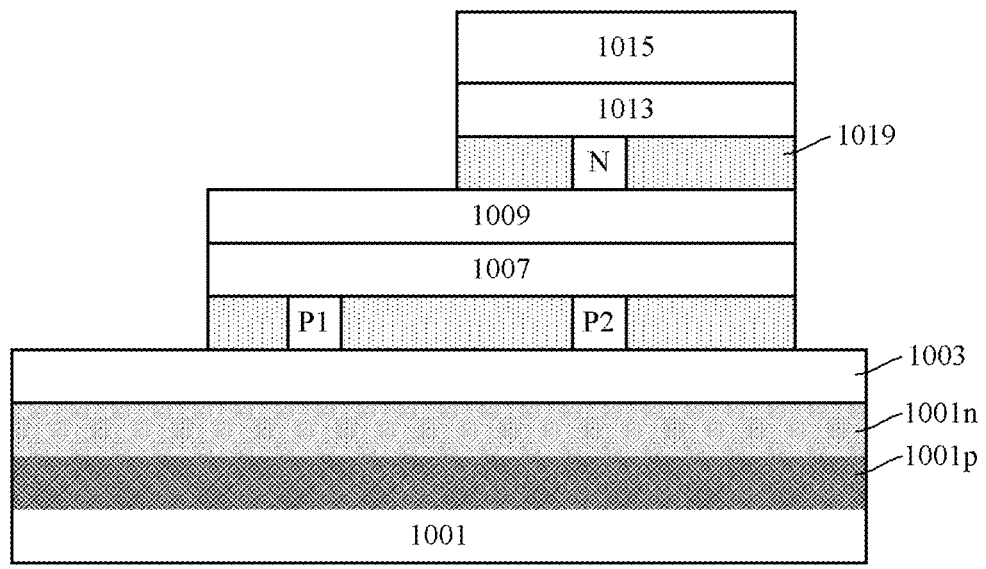

Next, the gate stacks may be formed in the recesses of the channel layers with respect to the source/drain layers. To make the protruding gate stacks for convenience of the manufacture of contacts as described above, a material layer may be filled into the recesses to occupy the spaces for the gate stacks (and thus can be termed as "sacrificial gates"). For example, this can be done by depositing oxynitride on the structure shown in FIGS. 7(*a*) and 7(*b*) and then etching the deposited oxynitride back by, for example, RIE. The RIE may be performed in a direction substantially perpendicular to the substrate surface, so that the oxynitride can be left only within the recesses, resulting in the sacrificial gates 1019, as shown in FIG. 8. In this case, the sacrificial gates 1019 may substantially fill the recesses up.

Figure 9A:
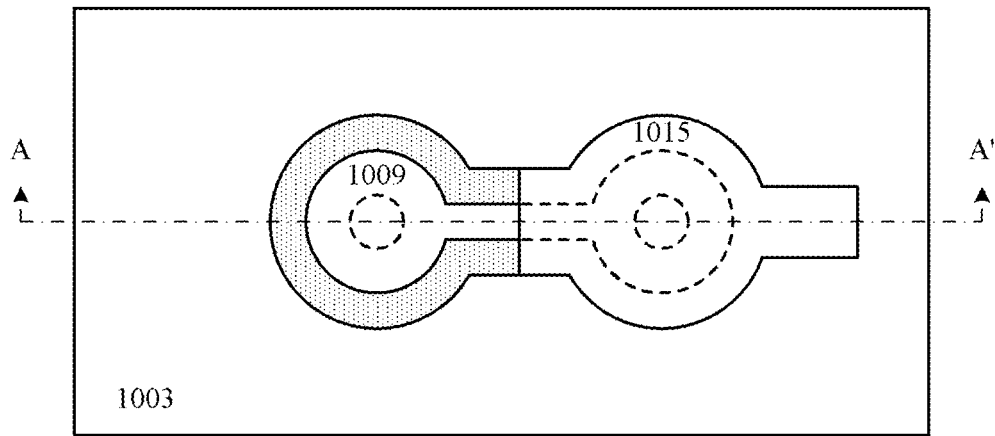
Figure 9B:
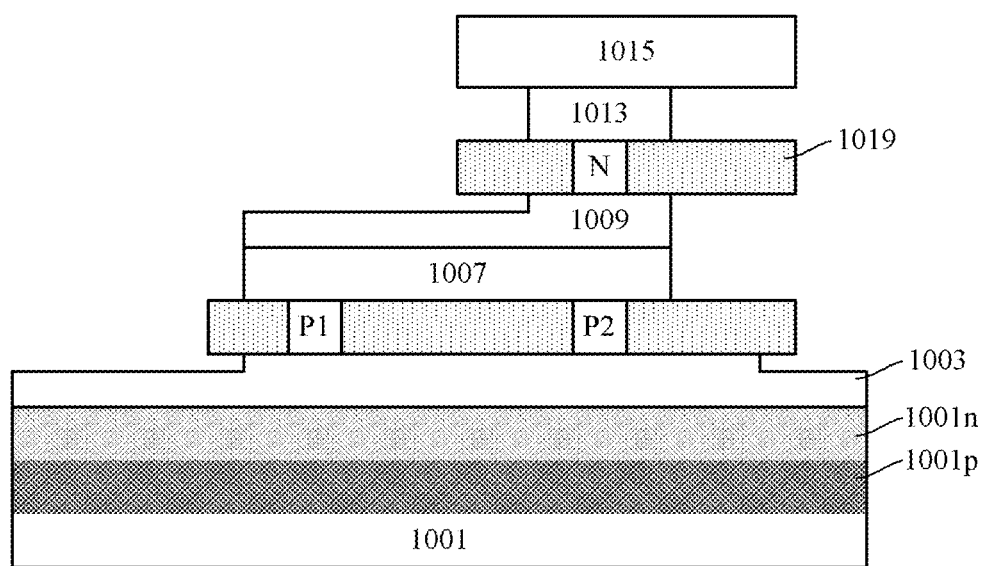

Then, as shown in FIGS. 9(*a*) and 9(*b*) (FIG. 9(*a*) is a top view, and FIG. 9(*b*) is a sectional view taken along line AA' in FIG. 9(*a*)), the source/drain layers 1007, 1009, 1013 may be selectively etched, so that their edges are recessed inwards and thus the sacrificial gates 1019 protrude with respect to their respective overlying active material layers.

Here, similarly, isotropic etching may be used. The second p-device source/drain layer 1007 and the first n-device source/drain layer 1009 present the same shape as the photoresist 1017 (the gourd shape as described above), and the etching goes on inwards isotropically from the periphery of this shape. Since the line width W1 of the connection portion>the line width W2 of the extending portion as described above, the extending portion will be etched away firstly as the etching goes on. Here, the time of the etching or the number of the etching cycles of ALE may be controlled, so that the etching goes on until the extending portion is etched away while the connection portions remains uncut (still with a certain width). Further, the island shaped (the circle shaped, in this example) first and second main-body portions have their respective periphery recessed inwards. As a result, the second p-device source/drain layer 1007 and the first n-device source/drain layer 1009 may present a dumbbell shape after being etched. In addition, the first n-device source/drain layer 1009 may have some of its top surface etched and thus lowered in level because it is exposed to the outside.

The second n-device source/drain layer 1013 presents the same shape as that of the portions of the dielectric layer 1015 covered by the photoresist 1017' (having the island shaped main-body portion, with the protrusions on the opposite sides), and the etching goes on inwards isotropically from the periphery of this shape. Similarly, the second n-device source/drain layer 1013 may present an island shape (perhaps with some protrusion at a location corresponding to the connection portion) after being etched.

In addition, the first p-device source/drain layer 1003 may have some of its top surface etched and thus lowered in level because it is exposed to the outside.

Here, to further improve the performances, thermal annealing may be performed to drive the impurities from the source/drain layers into the channel layers (for example, the p-type impurities in the first p-device source/drain layer 1003 may be driven into lower ends of the p-device channel layers P1 and P2, and the p-type impurities of the second p-device source/drain layer 1007 may be driven into upper ends of the p-device channel layers P1 and P2; and the n-type impurities in the first n-device source/drain layer 1009 may be driven into a lower end of the n-device channel layer N, and the n-type impurities of the second n-device source/drain layer 1013 may be driven into an upper end of the n-device channel layer N). As a result, there is some doping distribution in the lower and upper ends of the respective channel layers. Such doping concentration helps to reduce the resistance between the source/drain regions when the device is ON, resulting in improved device performances.

Figure 10:
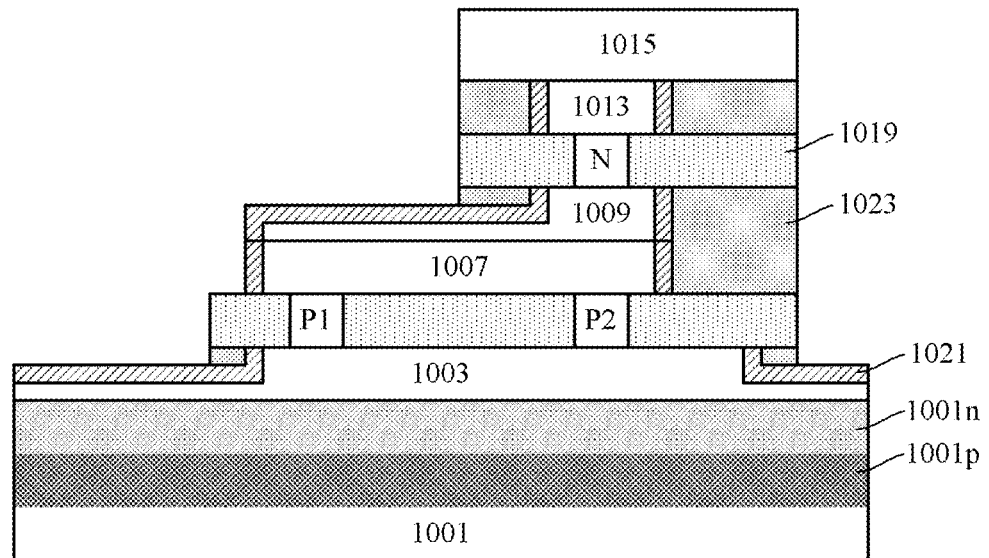

Further, to reduce contact resistance, silicidation process may be performed. For example, a layer of NiPt (with a content of Pt being about 1-10%) may be deposited on the structure shown in FIGS. 9(*a*) and 9(*b*), and then annealing may be conducted at a temperature of about 200-600° C., so that NiPt reacts with SiGe to produce a silicide (here, SiNiPt) layer 1021, as shown in FIG. 10. After that, the remaining unreacted NiPt may be removed.

Since some surface portions of the source/drain layers 1-03, 1007, 1009, 1013 are converted into the silicide, their respective periphery is recessed inwards. As a result, the periphery of the channel layers is not necessarily recessed, but may instead protrude, with respect to the periphery of the corresponding source/drain layers. However, because the sacrificial gates have already held the spaces for the gate stacks, the manufacture of the gate stacks will not be influenced even if the periphery of the channel layers may perhaps protrude with respect to the periphery of the corresponding source/drain layers.

Next, the replacement gate process may be performed to replace the sacrificial gates with the true gate stacks.

To do this, gaps existing between the respective layers can be filled. For example, as shown in FIG. 10, a layer of oxide 1023 may be deposited on the substrate, and then etched back (by, for example, RIE in a direction substantially perpendicular to the substrate surface), so that the oxide will fill into the respective gaps. Before the etching back, the deposited oxide may be planarized by, for example, CMP.

As shown in FIG. 10, in spite of the filling of the oxide 1023, the sacrificial gates 1019 still have their side walls exposed outside due to their protrusion configuration, so that they are ready to be replaced.

Figure 11:
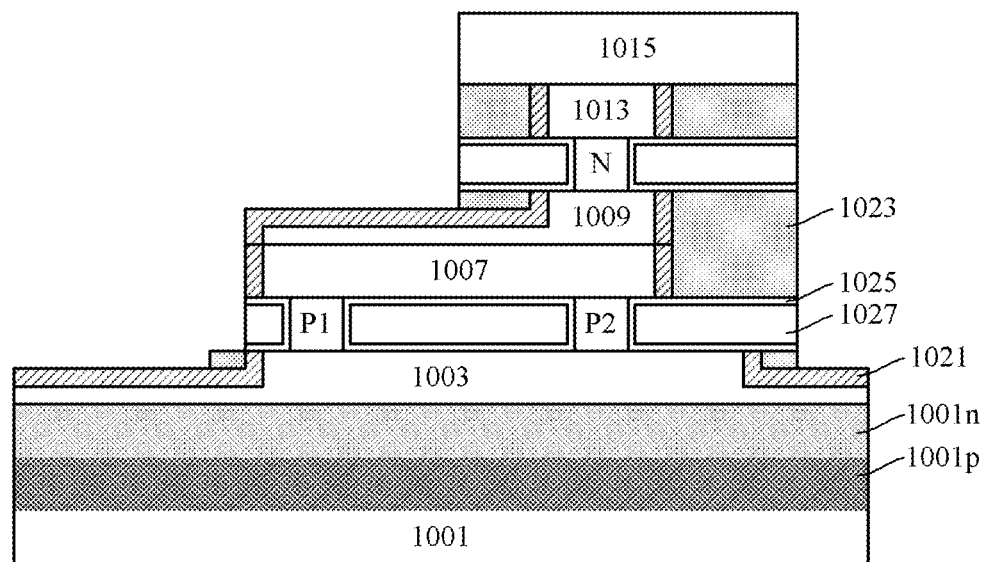

As shown in FIG. 11, the sacrificial gates 1019 may be removed by selective etching, and then the gate stacks may be formed in the spaces due to the removal of the sacrificial gates 1019. Specifically, a gate dielectric layer 1025 and a gate conductor layer 1027 may be deposited in sequence, and then portions thereof outside the spaces due to the removal of the sacrificial gates 1019 may be removed by selective etching (for example, RIE in a direction substantially perpendicular to the substrate surface). Here, the gate dielectric layer 1025 may comprise high-K dielectric such as $HfO_2$, and the gate conductor layer 1027 may comprise a metal gate conductor. Further, there may be a work function adjustment layer disposed between the gate dielectric layer 1025 and the gate conductor layer 1027.

Figure 12:
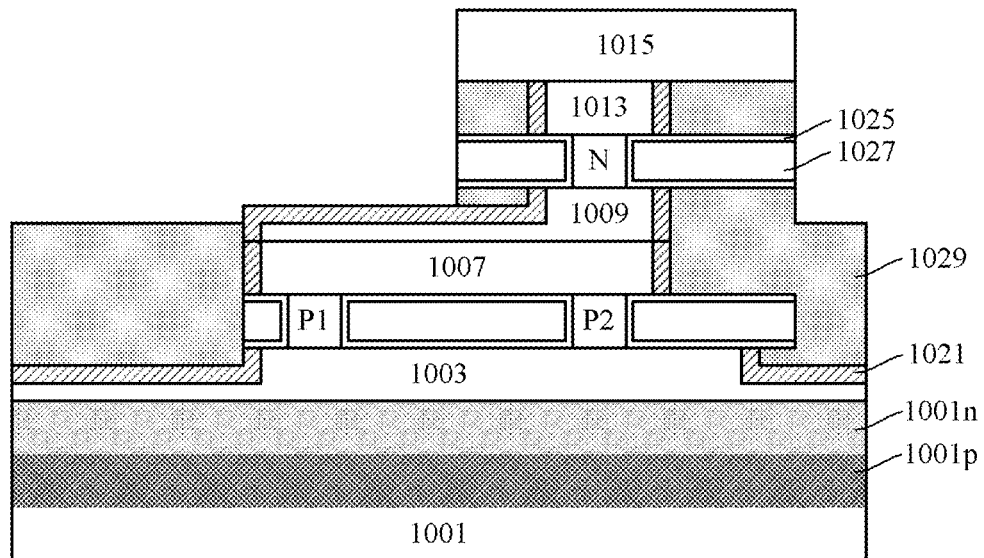

Further, different gate stacks may be provided for the n-type device and the p-type device. To do this, as shown in FIG. 12, a dielectric layer 1029 may be formed to protect the gate stack 125/127 for the p-type device. For example, oxide may be deposited on the structure shown in FIG. 11, and then the deposited oxide may be planarized by, for example, CMP, and then etched back (by, for example, RIE in a direction substantially perpendicular to the substrate surface), to form the dielectric layer 1029. In this example, since the dielectric layer 1029 and the oxide 1023 are of the same material, they are shown together as 1029 in FIG. 12. The dielectric layer 129 may expose the gate stack formed around the periphery of the n-device channel layer N, while covering the gate stack formed around the periphery of the p-device channel layers P1 and P2. For example, the dielectric layer 1029 after being etched back may have its top surface at a level between top and bottom surfaces of the first n-device source/drain layers 1009.

Figure 13:
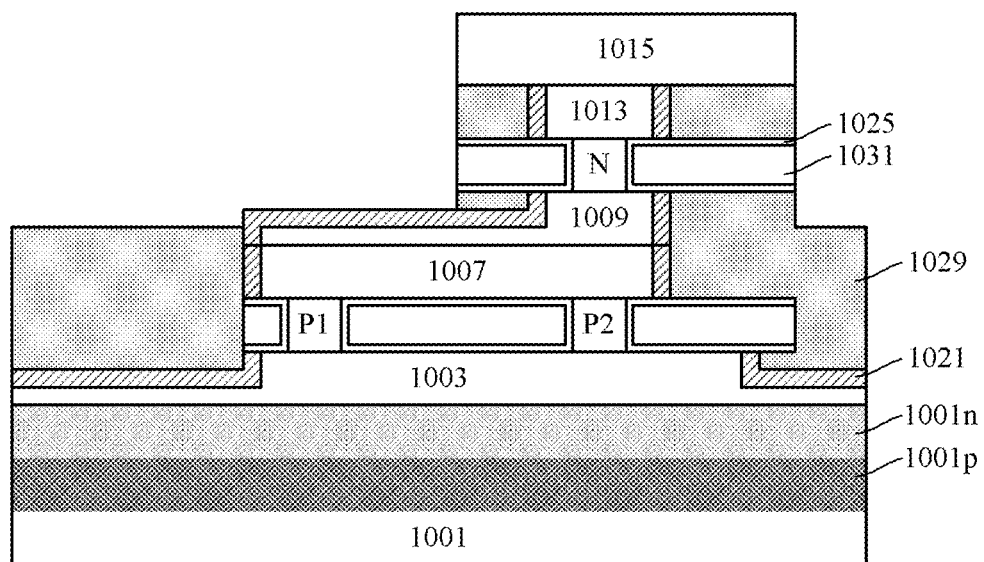

Subsequently, as shown in FIG. 13, the gate conductor layer 1027 (and the work function adjustment layer, if any) may be removed by selective etching, and a gate conductor layer 1031 (and also a possible work function adjustment layer) for the n-type device may be formed. In this example, the gate dielectric layer 1025 is not replaced, but is it is possible to replace this layer.

Thus, the gate stacks may be embedded into the respective recesses, and thus overlap with an entire height of the respective channel layers.

Then, electrical contacts may be made.

Figure 14:
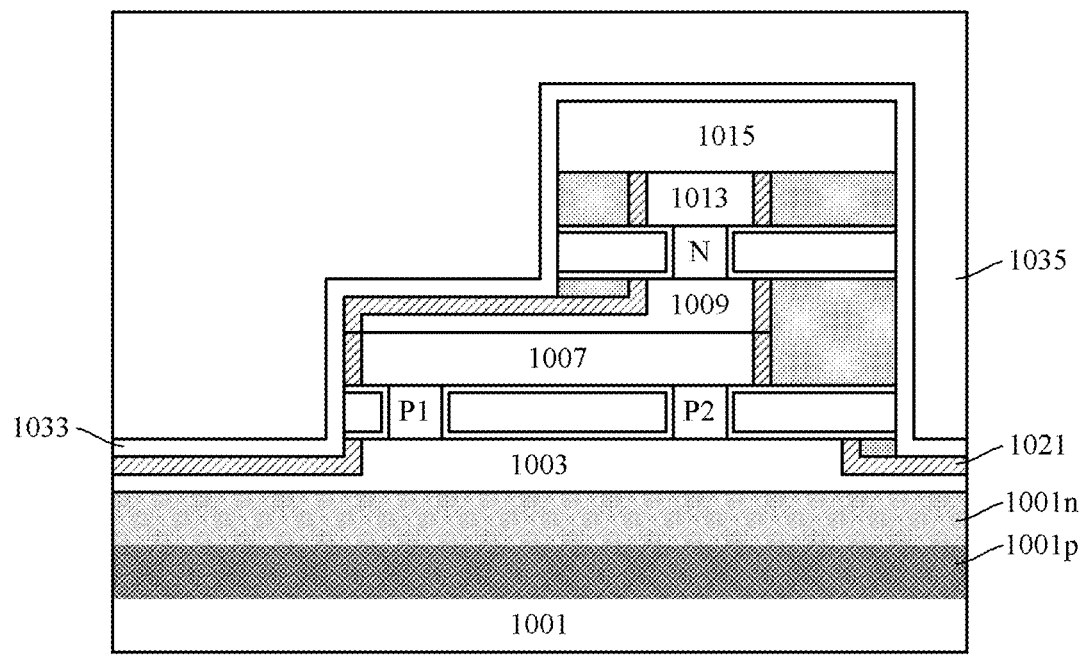
Figure 15:
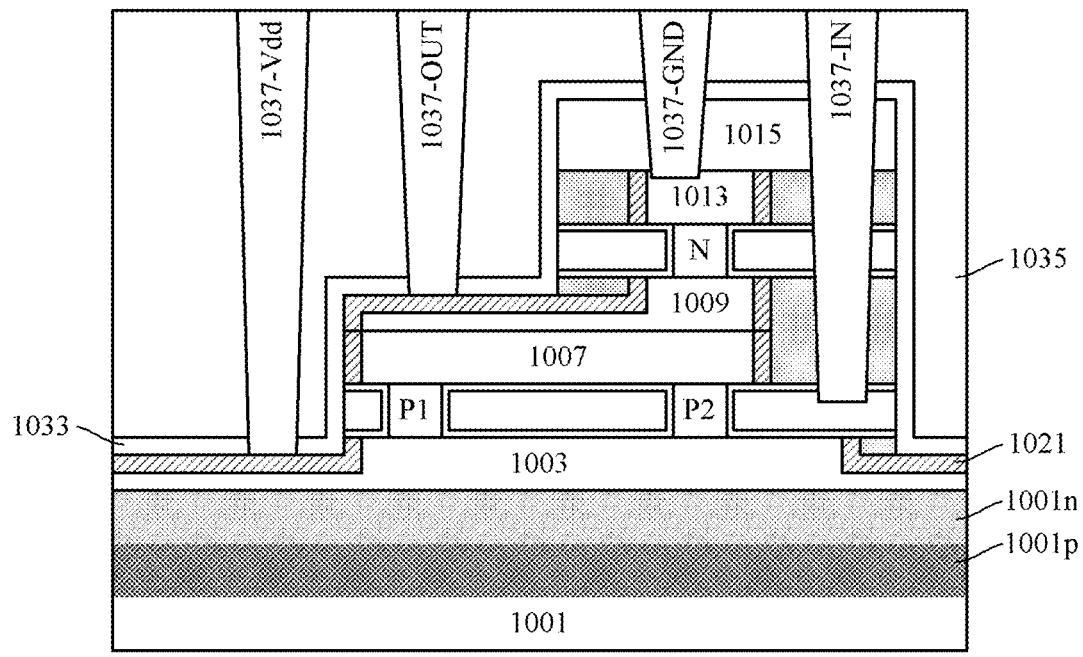

For example, as shown in FIG. 14, the dielectric layer 1029 may be at least partially removed by selective etching (for example, RIE in a direction substantially perpendicular to the substrate surface), and then a liner layer 1033 may be deposited on the resultant structure. The liner layer 1033 may include nitride, and can serve as an etching stopper layer or a device protection layer. Then, an interlayer dielectric layer 1035 may be formed. For example, oxide may be deposited and then planarized by, for example CMP, to form the interlayer dielectric layer 1035. Then, as shown in FIG. 15, in the interlayer dielectric layer 1035, a contact 1037-GND to the second n-device source/drain layer 1013, a contact 1037-OUT to the first n-device source/drain layer 1009 (and also the second p-device source/drain layer 1007), a contact 1037-Vdd to the first p-device source/drain layer 1003, and a contact 1037-IN to the gate conductor layers 1021 and 1031 may be formed. The contacts may be formed by etching holes in the interlayer dielectric layer 1035 and the relevant material layers and then filling a conductive material such as metal in the holes.

As described above, all those contacts are positioned above the footprint of the devices, and thus need no additional area.

In etching the holes, at least some of the holes may have different etching depths, and thus it is difficult to control the stop of the etching. Due to the presence of the liner layer 1033, the etching of the interlayer dielectric layer 1035 may be stopped at the liner layer 1033, so that it is relatively easy to control the etching depths.

Figure 16:
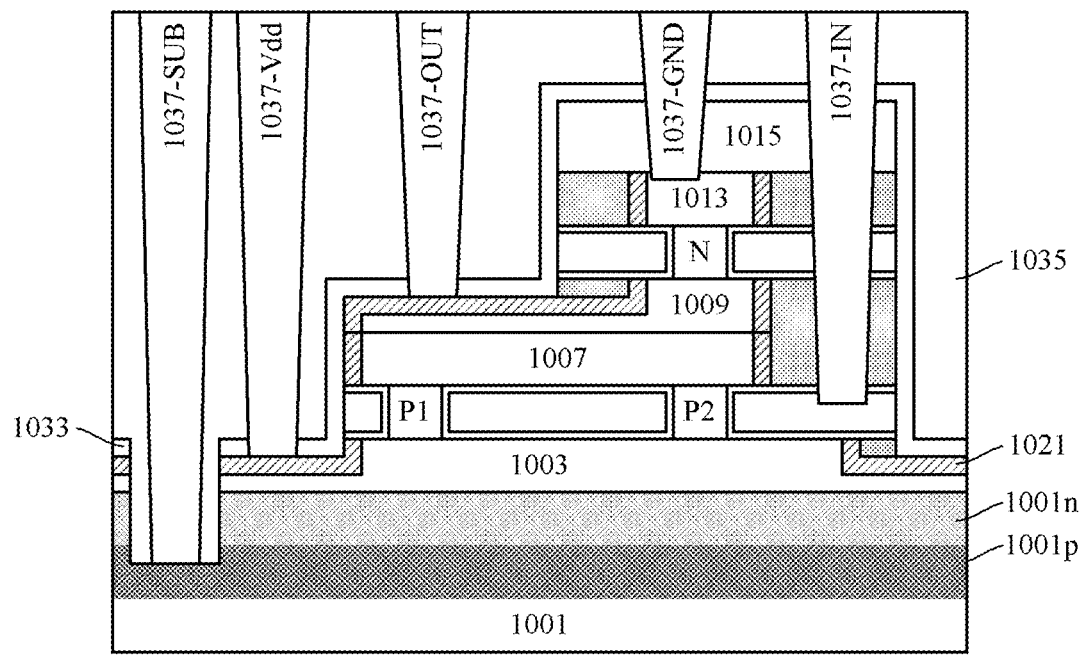
FIG. 16 is a sectional view showing an IC unit according to another embodiment of the present disclosure.

FIG. 16 is a sectional view showing an IC unit according to another embodiment of the present disclosure. As shown in FIG. 16, the IC unit according to this embodiment is the same as the IC unit described in the above embodiment, except that there is still a contact 1037-SUB to the substrate.

Figure 17:
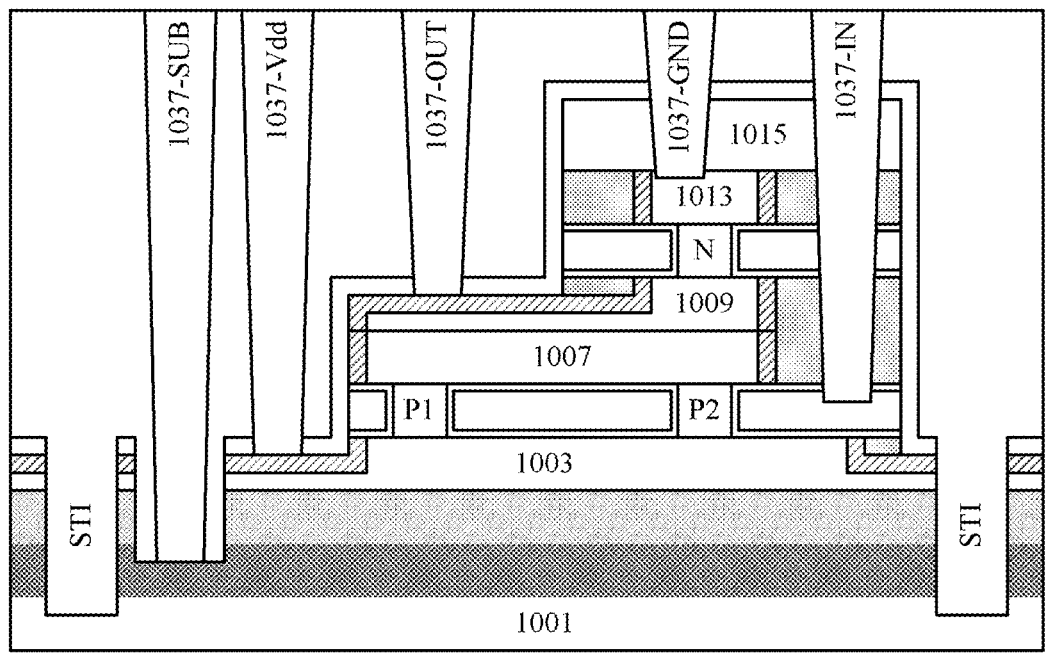
FIG. 17 is a sectional view showing an IC unit according to another embodiment of the present disclosure.

FIG. 17 is a sectional view showing an IC unit according to another embodiment of the present disclosure. As shown in FIG. 17, the IC unit according to this embodiment is the same as the IC unit shown in FIG. 16, except that the IC unit is formed within a region defined by Shallow Trench Isolation (STI).

The IC units according to the embodiments are applicable to various electronic devices. For example, an Integrated Circuit (IC) may be formed by integrating a plurality of such IC units and also other devices (for example, FET or the like), from which an electronic device may be made. Therefore, the present disclosure further provides an electronic device comprising the above IC unit. The electronic device may also comprise components such as a display operatively coupled to the IC unit and a wireless transceiver operatively coupled to the IC unit, or the like. Such an electronic device may comprise, for example, a smart phone, a computer, a tablet Personal Computer (PC), a wearable smart device, a mobile power supply, or the like.

According to an embodiment of the present disclosure, there is also provided a method of manufacturing a System on Chip (SoC). The method may comprise the above method of manufacturing the IC unit. In particular, a number of various devices may be integrated on a chip, and at least some of the devices are manufactured by the method according to the present disclosure.

In the above descriptions, details of patterning and etching of the layers are not described. It is to be understood by those skilled in the art that various measures may be utilized to form the layers and regions in desired shapes. Further, to achieve the same feature, those skilled in the art can devise processes not entirely the same as those described above.

From the foregoing, it will be appreciated that specific embodiments of the disclosure have been described herein for purposes of illustration, but that various modifications may be made without deviating from the disclosure. In addition, many of the elements of one embodiment may be combined with other embodiments in addition to or in lieu of the elements of the other embodiments. Accordingly, the technology is not limited except as by the appended claims.

We claim:

1. A method of manufacturing an Integrated Circuit (IC) unit, comprising:
providing a stack of a first source/drain layer, a channel layer and a second source/drain layer for a first device and a first source/drain layer, a channel layer and a second source/drain layer for a second device on a substrate;
selectively etching the channel layer of the second device and the channel layer of the first device, so that the channel layer of the second device has its periphery recessed inwards with respect to that of the first and second source/drain layers of the second device, and that the channel layer of the first device has its periphery recessed inwards with respect to that of the first and second source/drain layers of the first device and is separated into a first portion and a second portion spaced apart from each other; and
forming a first gate stack and a second gate stack to surround the periphery of the respective channel layers of the first device and the second device, respectively.

2. The method according to claim 1, wherein the stack is provided by epitaxy.

3. The method according to claim 2, wherein the first and second source/drain layers of the first device and the first and second source/drain layers of the second device are doped in situ while being grown.

4. The method according to claim 1, wherein selectively etching the channel layer of the second device comprises:
selectively etching the second source/drain layer of the second device, so that the second source/drain layer of the second device has a reduced area with respect to the remaining source/drain layers; and
selectively etching the channel layer of the second device, so that the channel layer of the second device is recessed with respect to the etched second source/drain layer of the second device.

5. The method according to claim 4, further comprising:
selectively etching the first source/drain layer of the second device and the second source/drain layer of the first device, so that they protrude with respect to the etched second source/drain layer of the second device, but has a reduced area with respect to the first source/drain layer of the first device.

6. The method according to claim 5, wherein the first source/drain layer of the second device and the second source/drain layer of the first device after being selectively etched have their respective periphery substantially coinciding with each other.

7. The method according to claim 5, wherein forming the first gate stack and the second gate stack comprises:
forming a first sacrificial gate and a second sacrificial gate in the recess of the channel layer of the first device with respect to the first source/drain layer of the second device and the second source/drain layer of the first device and in the recess of the channel layer of the second device with respect to the second source/drain layer of the second device, respectively;
selectively etching the second source/drain layer of the first device and the first and second source/drain layers of the second device to reduce their areas, so that the first sacrificial gate has a portion protruding with respect to the first source/drain layer of the second device and the second source/drain layer of the first device, and that he second sacrificial gate has a portion protruding with respect to the second source/drain layer of the second device; and
replacing the first sacrificial gate and the second sacrificial gate with the first gate stack and the second gate stack, respectively.

8. The method according to claim 1, wherein selectively etching the channel layer of the second device and the channel layer of the first device comprises:
- providing a mask on the stack, wherein the mask comprises a first main-body portion, a second main-body portion, and a connection portion between the first main-body portion and the second main-body portion, and also an extending portion which extends outwards from a periphery of the first main-body portion, wherein the extending portion has a line width smaller than that of the connection portion;
- selectively etching the second source/drain layer, the channel layer, and the first source/drain layer of the second device, and also the second source/drain layer and the channel layer of the first device in sequence by using the mask;
- providing a shielding layer on the stack to shield a portion of the stack corresponding to the first main-body portion and the extending portion of the mask;
- selectively etching the second source/drain layer and the channel layer of the second device with the presence of the shielding layer;
- removing the shielding layer;
- selectively etching the channel layer of the second device and the channel layer of the first device, so that the channel layer of the second device has its periphery recessed with respect to that of the first main-body portion of the mask, and that the channel layer of the first device is separated into the first portion and the second portion spaced apart from each other and recessed respectively with respect to the periphery of the first main-body portion and the periphery of the second main-body of the mask.

9. The method according to claim 8, wherein forming the first gate stack and the second gate stack comprises:
- forming a first sacrificial gate and a second sacrificial gate to surround the periphery of the respective channel layers of the first device and the second device, respectively;
- selectively etching the second source/drain layer of the first device, the first source/drain layer of the second device, and the second source/drain layer of the second device, so that the second source/drain layer of the second device has its periphery recessed with respect to that of the first main-body portion of the mask, but without any portion corresponding to the extending portion, and that the second source/drain layer of the first device and the first source/drain layer of the second device each comprise a first portion and a second portion, having their respective periphery recessed with respect to that of the first main-body portion and the second main-body portion of the mask, respectively, and also a connection portion between the first and second portions; and
- replacing the first sacrificial gate stack and the second sacrificial gate stack with the first gate stack and the second gate stack, respectively.

10. The method according to claim 1, wherein the selective etching comprises Atomic Layer Etch (ALE) or Digital Etch.

* * * * *